United States Patent
Michael et al.

(10) Patent No.: US 9,257,283 B2
(45) Date of Patent: Feb. 9, 2016

(54) DEVICE HAVING REDUCED BIAS TEMPERATURE INSTABILITY (BTI)

(75) Inventors: Joseph Darryl Michael, Delmar, NY (US); Stephen Daley Arthur, Glenville, NY (US); Tammy Lynn Johnson, Ballston Lake, NY (US); David Alan Lilienfeld, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/567,791

(22) Filed: Aug. 6, 2012

(65) Prior Publication Data

US 2014/0034963 A1 Feb. 6, 2014

(51) Int. Cl.
*H01L 29/15* (2006.01)
*H01L 21/00* (2006.01)
*H01L 21/04* (2006.01)
*H01L 29/66* (2006.01)
*H01L 29/78* (2006.01)

(52) U.S. Cl.
CPC ...... *H01L 21/0485* (2013.01); *H01L 29/66068* (2013.01); *H01L 29/7827* (2013.01)

(58) Field of Classification Search
CPC combination set(s) only.
See application file for complete search history.

(56) References Cited

U.S. PATENT DOCUMENTS

| | | | |
|---|---|---|---|
| 5,705,830 A | 1/1998 | Siergiej et al. | |
| 6,544,853 B1 | 4/2003 | Lin | |
| 6,759,683 B1 | 7/2004 | Cole et al. | |
| 6,885,105 B2 | 4/2005 | Kakamu et al. | |
| 7,947,588 B2 | 5/2011 | Yu et al. | |
| 2006/0205172 A1* | 9/2006 | Gerlach et al. | 438/401 |
| 2006/0214198 A1 | 9/2006 | Matsuki et al. | |
| 2007/0045631 A1 | 3/2007 | Endo et al. | |
| 2009/0008649 A1 | 1/2009 | Suzuki | |
| 2009/0090920 A1* | 4/2009 | Endo et al. | 257/77 |
| 2009/0146213 A1* | 6/2009 | Matsuzawa | 257/365 |
| 2010/0295060 A1* | 11/2010 | Kudou | H01L 29/7828 257/77 |
| 2011/0215399 A1 | 9/2011 | Matsuura et al. | |
| 2012/0049202 A1* | 3/2012 | Nakano | 257/77 |
| 2013/0062622 A1* | 3/2013 | Tsuchiya | 257/77 |

FOREIGN PATENT DOCUMENTS

| | | |
|---|---|---|
| JP | 2007201490 A | 8/2007 |
| WO | 2007035304 A1 | 3/2007 |

OTHER PUBLICATIONS

Suzuki et al., "A Strategy using a Copper/Low-K Beol Process to Prevent Negative-Bias Temperature Instability (NBTI) in p-MOSFETs with Ultra-Thin Gate Oxide", Symposium on VLSI Technology.Digest of Technical Papers, pp. 216-217, 2002.

Houssa et al., "Negative Bias Temperature Instabilities in HfSiONITaN-based pMOSFETs", IEEE International Electron Devices Meeting IEDM Technical Digest, pp. 121-124, Dec. 13-15, 2004.

(Continued)

*Primary Examiner* — Selim Ahmed
*Assistant Examiner* — Moin Rahman
(74) *Attorney, Agent, or Firm* — John P. Darling

(57) ABSTRACT

A semiconductor device is disclosed along with methods for manufacturing such a device. In certain embodiments, the semiconductor device includes a source electrode formed using a metal that limits a shift, such as due to bias temperature instability, in a threshold voltage of the semiconductor device during operation. In certain embodiments the semiconductor device may be based on silicon carbide.

2 Claims, 4 Drawing Sheets

(56) References Cited

OTHER PUBLICATIONS

Maheta et al., "Comparison of Negative Bias Temperature Instability in HfSiO(N)/TaN and SiO(N)/poly-Si pMOSFETs", 14th International Symposium on the Physical and Failure Analysis of Integrated Circuits, pp. 91-95, Jul. 11-13, 2007.

Rafik et al., "Impact of Tin Metal Gate on NBTI Assessed by Interface States and Fast Transient Effect Characterization", IEEE International Electron Devices Meeting, pp. 825-828, Dec. 10-12, 2007.

O'Sullivan et al., "Reliability Study of La2o3 Capped HfSiON High-Permittivity N-Type Metal-Oxide-Semiconductor Field-Effect Transistor Devices with Tantalum-Rich Electrodes", Journal of Applied Physics, vol. 104, Issue: 4, pp. 044512-044512-7, Aug. 2008.

Huang et al., "InGaAs Mosfet Performance and Reliability Improvement by Simultaneous Reduction of Oxide and Interface Charge in ALD (La)AlOx/ZrO2 Gate Stack", IEEE International Electron Devices Meeting (IEDM), pp. 1-4, Dec. 7-9, 2009.

European Search Report and Written Opinion issued in connection with corresponding EP Application No. 13179428.1-1552 on Oct. 15, 2014.

* cited by examiner

US 9,257,283 B2

DEVICE HAVING REDUCED BIAS TEMPERATURE INSTABILITY (BTI)

BACKGROUND

The subject matter disclosed herein relates to semiconductor devices and, more specifically, to improving stability of semiconductor devices.

For a semiconductor device, such as a silicon carbide (SiC) transistor, bias temperature instability (BTI) may cause substantial variability in device performance. For example, negative bias temperature instability (NBTI) may result in a significant change or drift in the threshold voltage of a SiC device when operated under particular conditions, such as negative bias and/or elevated temperatures, over an extended period of time. The NBTI in SiC devices is thought to be a result of interfacial charge trapping (e.g., oxide charges), which may, for example, be induced by operating the device at an elevated temperature, and under a particular bias condition, for extended time periods. For example, a SiC metal-oxide-semiconductor field effect transistor (MOSFET) may experience a threshold voltage shift when subjected to combined voltage and temperature stressing due to NBTI.

In certain cases, the aforementioned NBTI may shift (e.g., decrease) the threshold voltage of a SiC device to the point that the device may become conductive even without an applied gate-source voltage, transforming a normally-off device into a normally-on device. As such, NBTI significantly impacts the reliability and performance of SiC devices. An industry-accepted solution to NBTI in SiC devices has yet to be determined. Accordingly, alleviating the NBTI issue in SiC devices is especially desirable in order to take advantage of the unique operating characteristics (e.g., higher operating temperatures, improved mechanical properties, improved electrical properties, and so forth) that SiC may offer to certain systems and applications.

BRIEF DESCRIPTION

In one embodiment, a method is provided for manufacturing a semiconductor device. In accordance with this method, a silicon carbide wafer suitable for semiconductor manufacture is provided. One or more semiconductor devices are manufactured on each silicon carbide wafer. A source electrode of each semiconductor device is formed by depositing a metal that limits a shift in the threshold voltage of the semiconductor device during operation.

In another embodiment, a metal-oxide field-effect transistor (MOSFET) device is provided. The MOSFET device includes a gate electrode and a substrate comprising silicon carbide and having a surface that supports the gate electrode and defines a surface normal direction. The substrate includes: a drift region including a first dopant type so as to have a first conductivity type; a well region adjacent to the drift region and proximal to the surface, wherein the well region includes a second dopant type so as to have a second conductivity type and a channel region disposed proximal to the gate electrode; and a source contact region adjacent to the well region, wherein the source contact region having the first conductivity type. The MOSFET devices also includes an inter-layer dielectric disposed about the gate electrode and on a portion of the surface of the substrate, a contact layer disposed on a portion of the surface of the substrate covering a portion of the source contact region; and a source electrode disposed over the inter-layer dielectric and in electrical contact with the source contact region. The source electrode comprises a metal that inhibits a shift in a threshold voltage of the MOSFET device during operation.

In another embodiment, a semiconductor device is provided. The semiconductor device comprises: a gate electrode disposed on an insulation layer; a source electrode, wherein the source electrode comprises a metal that inhibits a shift in a threshold voltage of the semiconductor device during operation; an inter-layer dielectric (ILD) disposed between the gate electrode and the insulation layer, and the source electrode; a source contact region, wherein the source contact region contacts both the source electrode and a well region and is either n-type or p-type; a silicon carbide substrate upon which the insulation layer, the source contact region, and the inter-layer dielectric are disposed, wherein the silicon carbide substrate is either n-type or p-type; the well region, wherein the well region extends into the silicon carbide substrate and is either n-type or p-type; and a drain electrode disposed on an opposite side of the silicon carbide substrate from the gate electrode.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As set forth above, BTI, such as NBTI, presents a challenge to semiconductor device reliability. It should be appreciated that the physics and chemistry associated with the BTI phenomenon are complex. As such, while the exact mechanism of BTI may not be entirely understood in all contexts, present embodiments provide systems and methods for inhibiting (e.g., reducing, limiting, alleviating, or otherwise diminishing) BTI, such as NBTI, during the operation of semiconductor devices (e.g., SiC MOSFETs). In particular, the present approach involves including a metal as the source electrode of a SiC semiconductor device that inhibits BTI to tolerable levels (e.g., on the order of tenths of a volt rather than on the order of several volts). In certain embodiments, a method includes a step in the semiconductor device manufacturing process where the metal is deposited as the source electrode. In other embodiments, a SiC semiconductor or a MOSFET device is provided that includes the metal as a source electrode.

While the following disclosure may be generally focused on NBTI in SiC MOSFETs, it should be appreciated that the solutions and techniques detailed herein for mitigating BTI may have applicability to other semiconductor devices, such as insulated gate bipolar transistors (IGBT), MOS controlled thyristors, and gate controlled thyristors. For explanatory purposes, a MOS Controlled thyristor (MCT) may include two MOSFETs built into the structure and may be sensitive to a shift in threshold voltage (VTH) as a result of BTI effects. It is also contemplated that the techniques detailed herein will also mitigate the effects related to positive bias threshold instability (PBTI), which refers to the VTH effects that occur under a positive bias.

Figure 1:
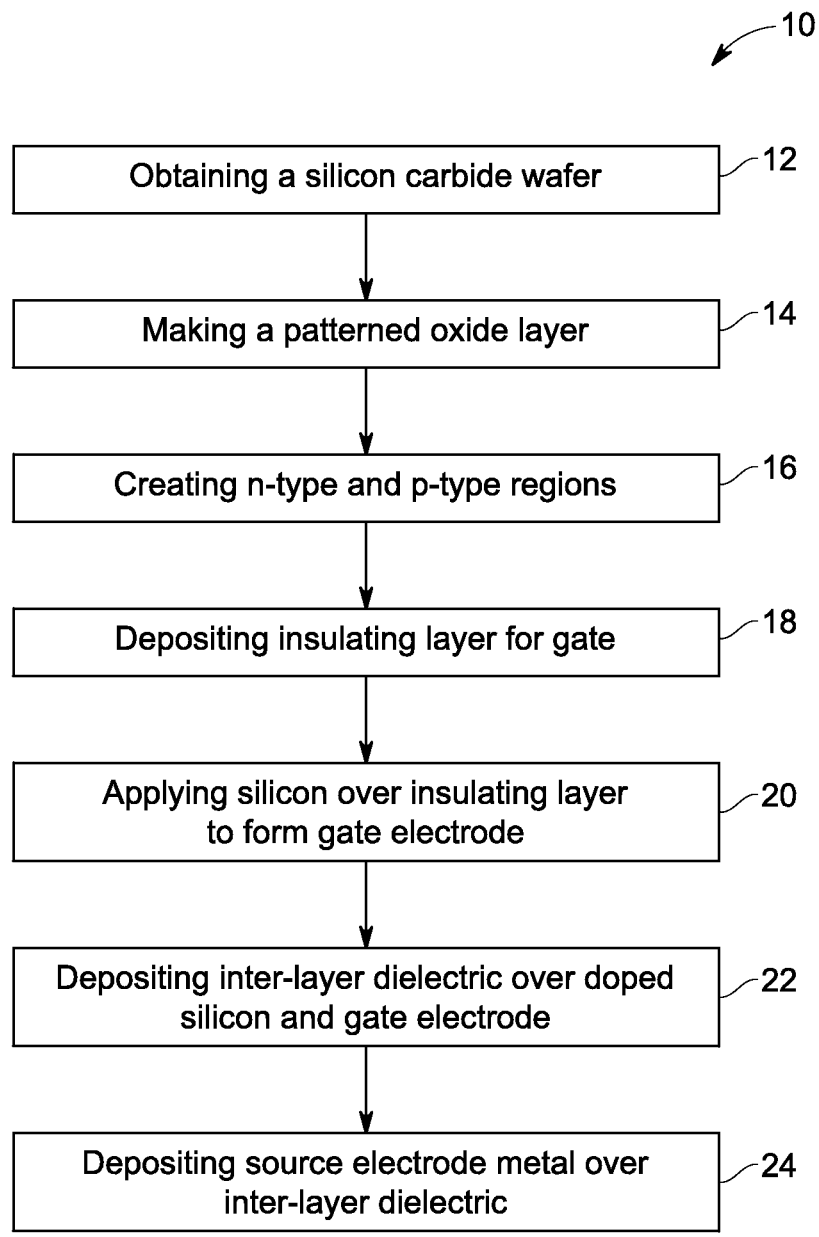
FIG. 1 is a process flow diagram of a transistor fabrication process in accordance with certain embodiments of a present technique.

With the foregoing in mind, FIG. 1 illustrates a process flow diagram of the steps of one example of a transistor fabrication process 10 in accordance with certain embodiments of the present approach. As represented by block 12, a silicon carbide wafer may be obtained. In one embodiment the wafer may be heated in a furnace to form a layer of silicon dioxide, also called the oxide layer. After the silicon carbide wafer is obtained and the oxide layer formed, patterns may be created in the oxide layer of the wafer, as represented by block 14.

In one implementation, in order to create the patterned oxide layer, a layer of photoresist may be applied over the surface of the oxide layer and baked dry. A mask defining the circuit features of the transistor may be applied to the photoresist, and the photoresist may be exposed to ultraviolet light. The sections of the photoresist that are exposed to the ultraviolet light may be softened and washed away by an alkaline solution. A strong acid may be applied to the wafer, and the sections of the oxide layer not protected by the photoresist may be dissolved. A solvent may be then used to clear the photoresist that remains. Therefore, a patterned oxide layer may remain on the silicon carbide wafer. As will be appreciated, though the above relates one approach for forming a suitable oxide pattern layer, any other suitable lithographic approach may be employed to form the desired traces and/or patterns on the oxide layer (or on other layers) of the device being fabricated.

After the desired oxide pattern is present on the silicon carbide wafer, n-type and p-type regions may be formed in the silicon carbide, as represented by block 16. For example, in one implementation the n-type and p-type regions (i.e. wells) may be created by exposing the wafer to an ion beam to implant donor or acceptor atoms into the silicon carbide surfaces. Different types of atoms create n-type and p-type wells. For example, a boron ion beam may create a p-type well, while a phosphorous ion beam may create an n-type well. The patterned oxide layer may be designed to allow for precise placement of the wells. When fabricating a transistor, boxes 14 and 16 may be repeated several times to create complex well patterns in the silicon carbide.

Depending on the device being fabricated, after the wells are in place, another oxide layer may be formed in the manner described above. A thin insulating layer may be deposited over a drift region as represented by box 18. In certain embodiments the insulating layer may be deposited or thermally grown on parts of the silicon carbide wafer. The insulating layer may be made of silicon dioxide or another suitable insulator. After the insulating layer is deposited 18, poly silicon may be deposited over the insulating layer to form a gate electrode, as represented by box 20. In certain embodiments, an additional low-resistance layer may be deposited over the poly silicon layer.

Once the poly silicon layer is deposited, an inter-layer dielectric (ILD) may be deposited over the poly silicon layer as represented by box 22. The ILD may be used to insulate the poly silicon or metal material of the gate electrode from a source electrode. A source electrode is then deposited over the ILD, as represented by box 24. As discussed herein, the source electrode may be made of a metal which inhibits or limits a shift in threshold voltage of a transistor during operation.

Figure 2:
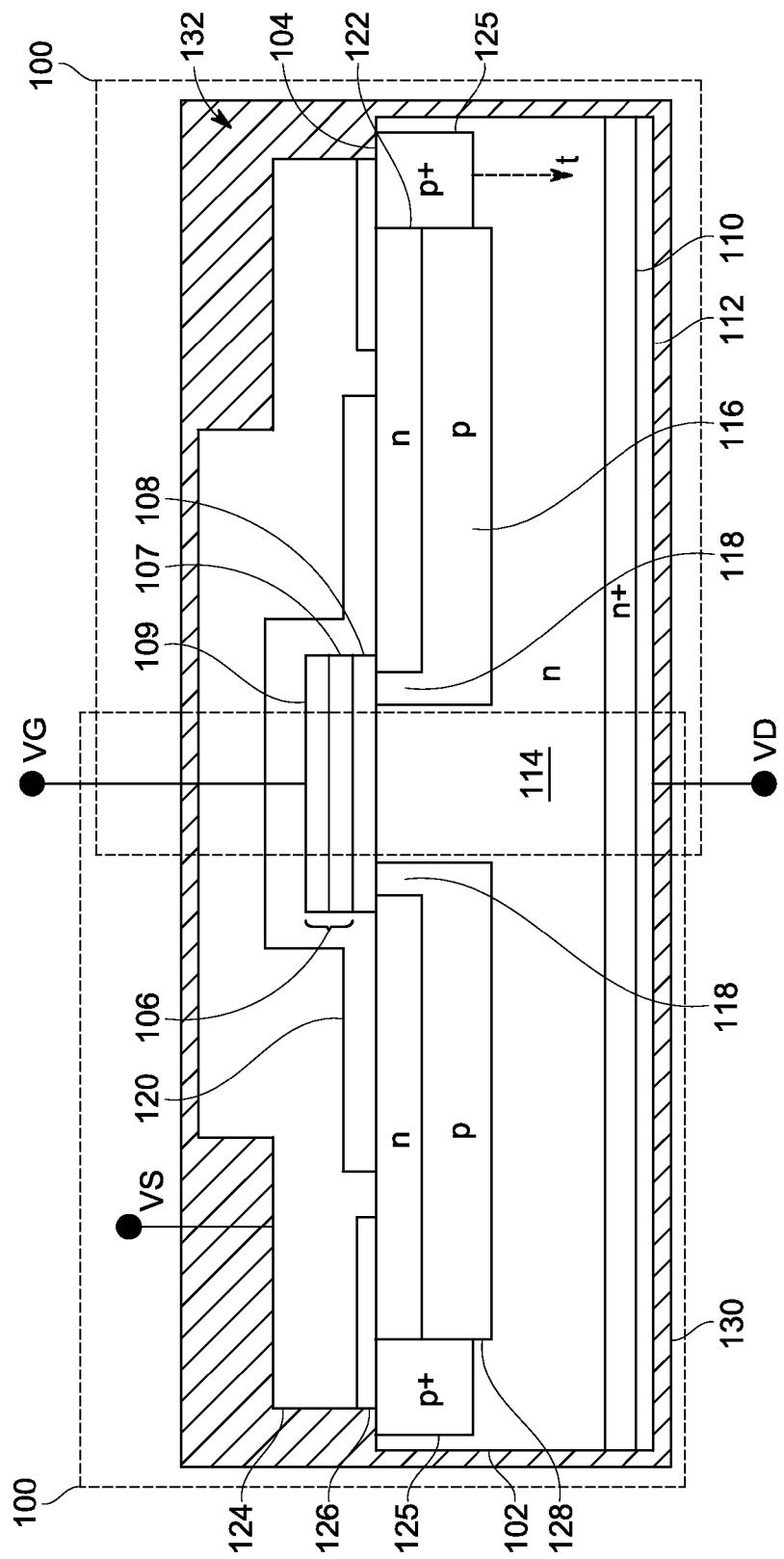
FIG. 2 is a schematic cross-sectional view of a SiC MOSFET, in accordance with an embodiment of the present approach.

With the foregoing example of a fabrication operation in mind, FIG. 2 illustrates a metal-oxide semiconductor field effect transistor (MOSFET) 100, in accordance with an embodiment of the present approach. In certain embodiments, the illustrated MOSFET 100 may be a SiC-based MOSFET designed for high-temperature operation (e.g., above approximately 125° C., above approximately 175° C., and/or above approximately 300° C.). Additionally, the illustrated MOSFET 100 may be fabricated using standard microelectronic fabrication processes, such as the process described above. These processes may include, for example, lithography, film deposition/growth methods (e.g., physical and chemical vapor deposition, plating, oxidation, etc.), crystal growth methods, and wet and dry etching methods. The illustrated MOSFET 100 includes a substrate 102, which may be made of a semiconductor material, such as silicon carbide (SiC). The substrate 102 may be a semiconductor die or wafer that defines a major surface 104 and a surface normal direction or "thickness direction," t, which extends normally from the surface and into the substrate 102. It should be appreciated that FIG. 2 is intended to illustrate the relative positions of the various components in one example of a MOSFET 100 and should not be construed as implying relative scales or dimensions of these components.

In the depicted embodiment, the illustrated surface 104 supports a gate electrode 106. Additionally, the illustrated gate electrode 106 is disposed on an insulation layer 108 (which may also be referred to as a gate oxide or gate dielectric layer) that is in direct contact with the surface 104 of the substrate 102. The insulation layer 108 may generally be made from an electrically insulating material, such as silicon dioxide ($SiO_2$). Furthermore, the illustrated insulation layer 108 extends along the surface 104 and may extend to any point up to the contact layer 126. The gate electrode 106 may include a polycrystalline silicon layer 107, and may also include a low-resistance layer 109 formed, for example, of electrically conductive material (e.g., metal and/or silicide). The gate electrode 106 may be configured to receive a gate voltage, VG.

The illustrated substrate 102 also defines a second surface 110 that is in contact with a drain electrode 112, which is generally configured to receive a drain voltage, VD. It should be noted that FIG. 2 is a schematic cross-sectional view of a single MOSFET cell and that the full MOSFET device is typically comprised of large number of cells, situated next to one another, which may share a common gate electrode 106 and drain electrode 112.

The illustrated substrate 102 includes a drift region 114 in addition to a well region 116, which is disposed adjacent to the drift region 114 and proximal to the surface 104. The drift region 114 may be doped with a first dopant type and have a first conductivity type with first majority charge carriers, while the well region 116 may be doped with a second dopant type and have a second conductivity type with second majority charge carriers. For example, in the SiC substrate 102 the first dopant type may be one or more of nitrogen and phosphorus ("n-type dopants"), while the second dopant type may be one or more of aluminum, boron, gallium, and beryllium ("p-type dopants"), resulting in n-doped and p-doped regions, respectively. For such an embodiment, the first and second majority charge carriers would be electrons and holes, respectively.

The illustrated substrate 102 further includes a source contact region 122 having the first conductivity type (e.g., n-type in FIG. 2). The well region 116 may be disposed proximal to the contact region 122 such that the well region 116 may include therein a channel region 118 disposed proximal to the gate electrode 106. For example, the channel region 118 may extend along the surface 104 under the gate electrode 106 (where "under" means further along the thickness direction t). Additionally, a dielectric layer 120, sometimes referred to as an inter-layer dielectric (ILD), may be disposed over the gate electrode 106 and the insulation layer 108. In one example the dielectric layer is a material including phosphorous silicate glass (PSG).

In one embodiment, the source contact region 122 may be disposed adjacent to the surface 104 and the well region 116 may surround the source contact region 122. The substrate 102, in certain embodiments, also includes a body contact region 125 having the second conductivity type (e.g., p-type in FIG. 2). The body contact region 125 in the illustrated embodiment is disposed adjacent to the well region 116 and to the surface 104.

A source electrode 124 (e.g., formed of metal, such as nickel) may be disposed over the source contact region 122 and body contact region 125 and may be configured to receive a source voltage, VS. Further, the source electrode 124 may be in electrical contact with both the source contact region 122 and body contact region 125. For example, in the illustrated embodiment, electrical contact between the source electrode 124 and the source contact region 122 and body contact region 125 is made via a contact layer 126 (e.g., formed of nickel or another suitable metal). Formation and composition of the source electrode 124 is discussed in greater detail below.

During operation, the MOSFET 100 may generally act as a switch. When a voltage difference VDS=VD−VS is applied between the drain electrode 112 and the source electrode 124, an output current (IDS) between those same electrodes can be modulated or otherwise controlled by an input voltage VGS applied to the gate electrode 106, wherein VGS=VG−VS. For gate voltages VG less than a "threshold voltage" (VTH) of the MOSFET 100, the current IDS remains nominally at about zero, although a relatively small leakage current may exist even for gate voltages below the threshold voltage. The threshold voltage VTH is a function of, amongst other things, the dimensions, materials, and doping levels in the MOSFET 100, and MOSFETs are typically designed so as to exhibit a predetermined threshold voltage VTH. Circuits incorporating the MOSFET 100 can then be designed to the expected (predetermined) threshold voltage VTH.

It should be appreciated that the threshold voltage (VTH) for a MOSFET is not uniquely defined. There are at least five different techniques for measuring VTH, and for a specific example, they do not necessarily produce exactly the same results. The method employed herein is referred to as the "threshold drain current method," in which the gate voltage at a specified drain current is taken to be the threshold voltage.

Figure 3:
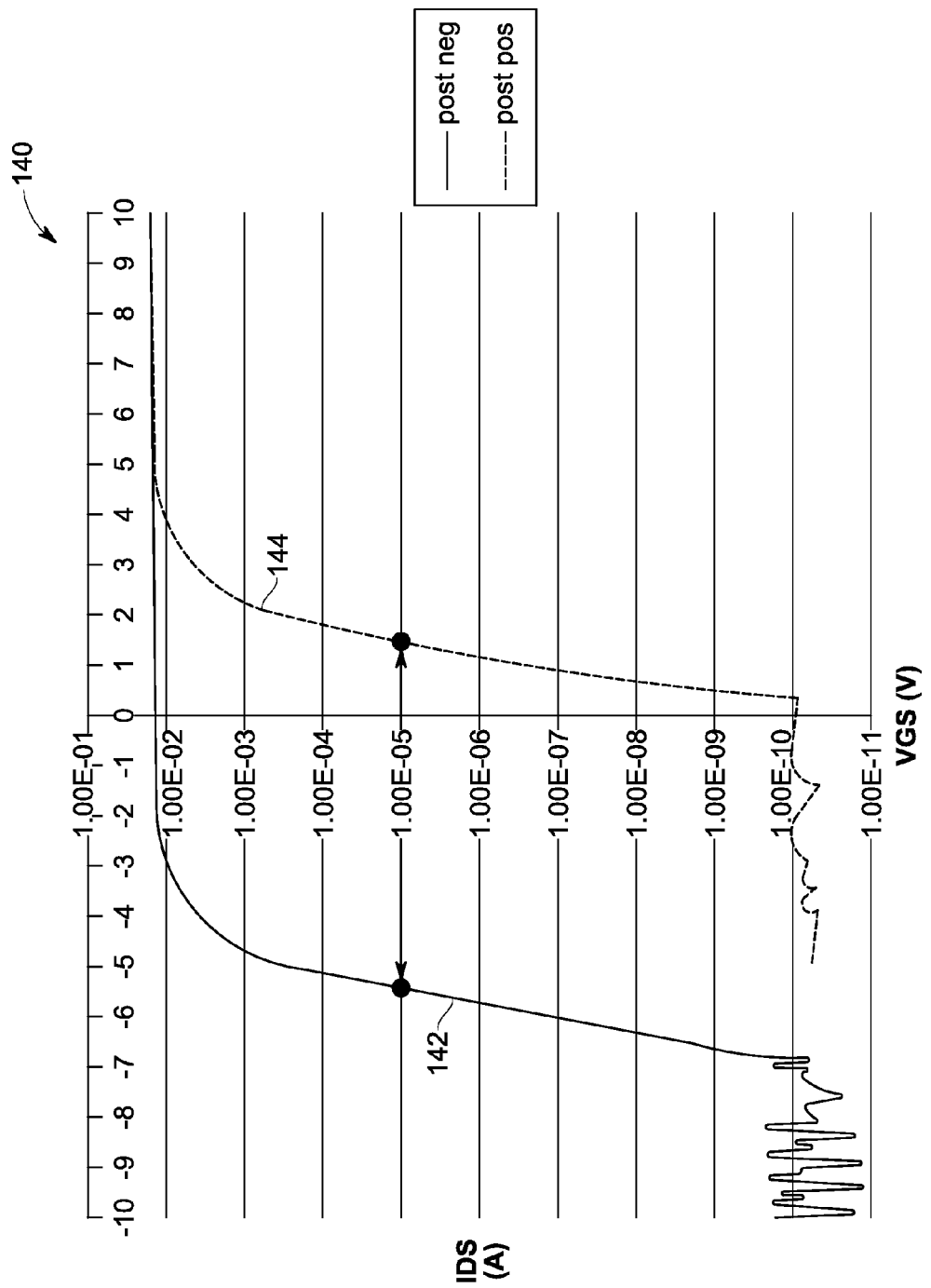
FIG. 3 is a plot of drain current as a function of gate voltage for a conventional MOSFET before and after voltage and temperature stressing.

Conventional MOSFETs, including SiC MOSFETs, have been found to experience a shift in the threshold voltage due to NBTI when subjected to a potential difference between the gate and source electrodes 106, 124 and, particularly, when subjected to this potential at elevated temperatures and for extended periods of time. Specifically, as mentioned, negative bias temperature instability (NBTI) is a concern for SiC devices. Illustrating an example of such a threshold voltage shift, FIG. 3 is a plot 140 of drain current as a function of gate voltage for a conventional MOSFET before and after voltage and temperature stressing. That is, FIG. 3 illustrates the NBTI effect in a stressed SiC MOSFET device lacking a source electrode 124 which limits the NBTI effect during operation, as discussed herein.

With respect to FIG. 3, a threshold drain current method, which is a variation of the "sub-threshold technique," may be used when characterizing the NBTI phenomenon in the SiC MOSFET device. Example test conditions used for generating the data illustrated in plot 140 of FIG. 3 are set forth below. In certain embodiments, the test conditions may be such that the transfer curve measurements are taken on MOSFETs at constant stress temperature. For example, first, the gate voltage may be held at a constant −20 volts (V) for 15 minutes and the VDS may be held at 0 V. Then, a small constant voltage may be applied between the source and drain terminals (e.g., 100 mV) and the gate voltage may be swept from −10 V to +10 V, a range large enough to capture the lower current range of the MOSFET (e.g., less than 0.1 nano-amps in this particular case) up to the saturation current (e.g., approximately 16 milli-amps), defining the "post neg" transfer curve 142 depicted in FIG. 3. A constant voltage gate positive stress bias of +20 V may then be applied to the gate for an additional 15 minutes, with VDS=0 V. Finally, a similar reverse sweep of the gate voltage may be conducted from +10 V to −10 V to capture the "post pos" transfer curve 144 with VDS=0.1 V.

The use of 10 micro-amps as the threshold drain current of choice for VTH determination is done for practical reasons. For example, it is small enough to reside on the linear sub-threshold portion of the semilog transfer curve, and is large enough to measure accurately and easy to extract from the data. The MOSFET parameters and test conditions for data collection were as follows: VDS=0.1 V; Temp=175° C.; gate oxide thickness (Tox)=500 Angstroms, Device Active Area=0.067 cm$^2$; Area of one MOS cell=1.6 E-4 cm$^2$; channel width to length ratio (W/L) of one MOS cell=6900. Scaling the threshold drain current to larger or smaller devices has a linear dependence on Device Active Area, Area of one MOS cell and W/L. It should be noted however, that threshold current scales inversely with gate oxide thickness (Tox).

Accordingly, FIG. 3 demonstrates the drift or shift in the threshold voltage (e.g., a shift in the voltage where IDS increases significantly) following positive and negative gate bias stressing. The vertical scale is the drain current (amps), the horizontal scale is the gate to source voltage (volts). The threshold voltage shift thus represents an example of the effects of bias temperature instability (BTI). The VTH drift is taken as the voltage difference between the VTH positive voltage stress value and the VTH negative voltage stress value at 10 micro-amps of source to drain current. In the example illustrated in FIG. 3, the VTH drift is approximately 6.9 V.

In experiments relating to certain embodiments, it was hypothesized that aluminum as a source electrode metal could be a factor contributing to NBTI—due to chemical reactivity of aluminum with hydrogen and OH radicals. In one set of experiments, bits of indium ribbon were used on devices that did not have the final source metal deposited. In these experiments, indium ribbons were pressed onto the source pad area of the SiC semiconductor and heated at 125° C. The heating approach improved indium's adhesion to the SiC semiconductor. Two types of tests were performed to study the effect of replacing aluminum with indium. The first series of tests were conducted in a chamber that could be pumped down to a low vacuum, yet still be raised to 125° C., a temperature sufficient to cause NBTI in the SiC semiconductors. The second tests were conducted under atmospheric conditions in heaters heated to 150° C. and 175° C. So data was acquired for 125° C. in a near vacuum, 125° C. in atmospheric conditions, 150° C. in atmospheric conditions, and 175° C. in atmospheric conditions. Each test indicated that the use of indium had alleviated the consequences of NBTI in the SiC semiconductor.

Figure 4:
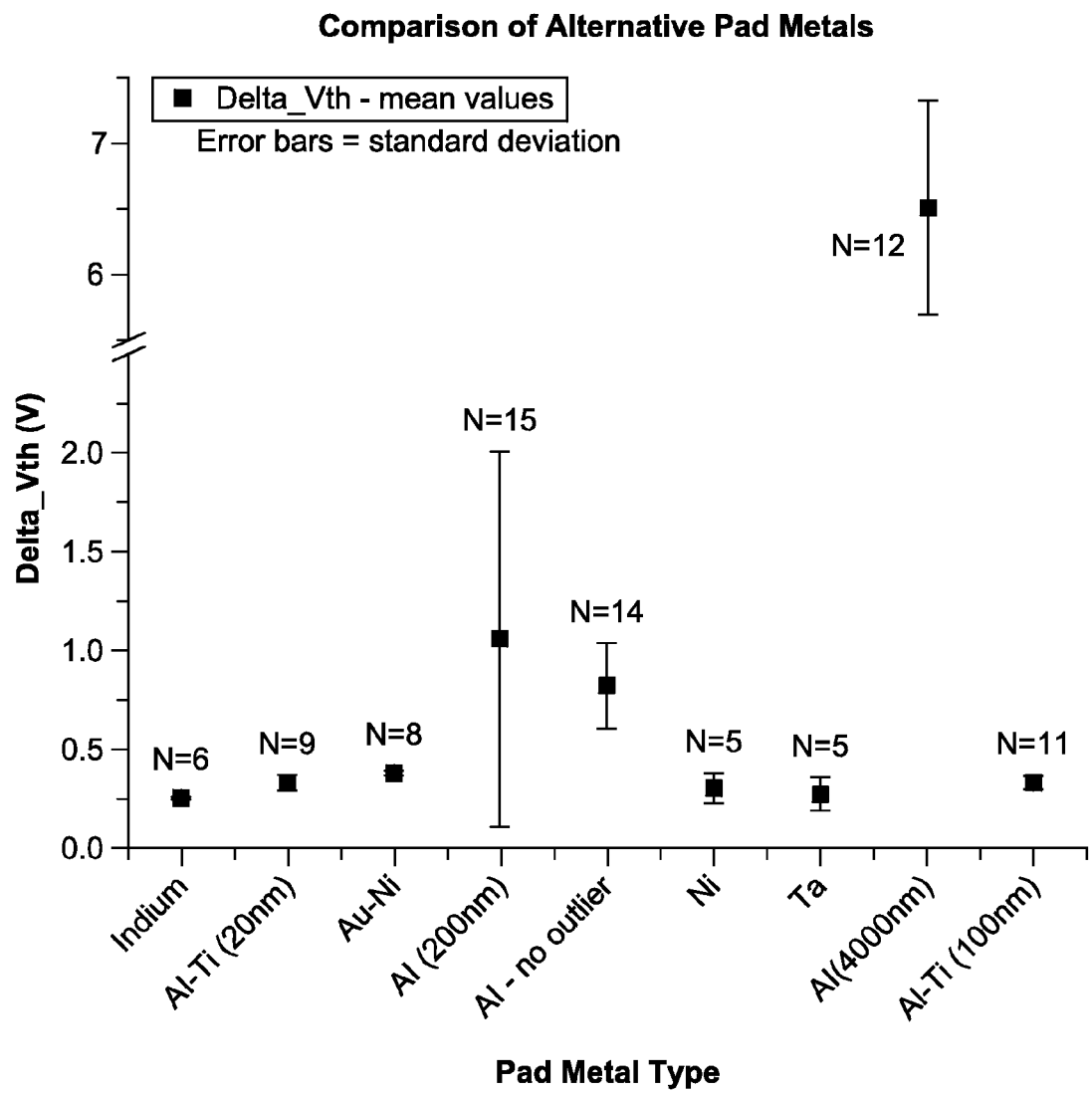
FIG. 4 is a graph comparison of the different threshold voltage shifts that occur with different metals in the embodiments of the present approach.

An extension of the experimental work with indium described above was to include other metals that could potentially demonstrate the same functionality as indium. In one set of experiments, metals that were good diffusion barriers to hydrogen were considered for use in forming source electrodes 124. In addition, another factor considered in evaluating metals to be used in forming source electrodes 124 was that the metals should not produce dissolved atomic hydrogen in silica from water. Further, if a metal does produce dissolved atomic hydrogen, it should function as a getter of hydrogen species. For example, titanium and aluminum both produce hydrogen in water, but titanium is able to getter hydrogen. With this in mind, FIG. 4 shows the benefit of adding a layer of titanium beneath an aluminum layer of the source electrode. Based upon the characteristics mentioned above, various metals and metal combinations were chosen to be tested: gold+10 nanometer nickel, nickel, tantalum, and aluminum. In one experiment, a 10 nanometer layer of nickel was chosen as an adhesion layer to aid in gold's adhesion to the semiconductor surface. Aluminum was employed as a baseline for comparing the NBTI measurements with the other metals.

To prepare the semiconductor for the alternative metals experiment, a silicon carbide wafer was removed after the lot reached the pad metal deposition step. Prior to metal deposition, it was patterned with the standard pad metal pattern but using a negative lift off resist. The patterned wafer was then laser cut into 12 rectangular pieces of roughly 20 die each. Rows or columns of die were sacrificed to make the cuts. Various metal layers were then deposited onto the pieces. The metal layers and thicknesses were as follows: gold (2000 Å)/nickel (100 Å), nickel (2000 Å), tantalum (2000 Å), aluminum (2000 Å), and aluminum (~100 Å). The following metals were also tested: aluminum (40000 Å), aluminum (40000 Å)/titanium (200 Å), and aluminum (40000 Å)/titanium (1000 Å). Some of the samples had a pre-cleaning of a 1 minute pre-sputter, while others had a pre-cleaning of a 1 minute pre-sputter, a wait, and another 1 minute pre-sputter. The gold/nickel sample was tested with both pre-cleaning methods, and the 2000 Å sample of aluminum was tested with no pre-cleaning. The metal samples were deposited with either a MRC643 sputter, a Perkin-Elmer sputter, or a Temescal sputter. After disposition, the samples were individually soaked in acetone in an ultrasonic bath. The acetone removed the resist pattern and the metal deposited on it. The pieces then received ST22 and PRS 1000 solvent cleans and were stored in a dry box in a cleanroom prior to testing for NBTI.

The results of the experiment are given in FIG. 4, in which a graph shows a comparison of different threshold voltage shifts for different source pad electrode metal types. The variable "N" above the data points represents the number of measurements taken. For the aluminum samples at 200 nm, two data points appear on the graph. The first Al (200 nm) data point represents the data set which included a single sample that had a voltage threshold shift value of 4.42 V. The data point labeled "Al—no outlier" contains the same data set with the outlier removed. Each of the metals (except for aluminum) compared on the graph have threshold voltage shifts of close to 0.25 V. The metals have a deviation of only about 0.05 to 0.2 V. On the other hand, aluminum has threshold voltages of close to 0.75 V for the 200 nm sample (no outlier), and close to 6.6 V for the 4000 nm sample. Both the 200 nm aluminum (no outlier) and the 4000 nm aluminum metals have large deviations of about 0.5 V and 1.5 V respectively. It should be appreciated that since BTI effects may induce a threshold voltage shift of several volts (e.g., 2 V to 6 V) in typical SiC MOSFETs, use of a source electrode 124 as discussed herein may afford a substantial improvement to device reliability.

The results of the experiment would suggest that indium is a suitable material for limiting the threshold voltage shift, though the method of application differed from the other metals tested, so a true comparison was difficult. Also, with the Al-only pad metal, NBTI measurements at 175° were between 2-4 times more than any of the other pad metals attempted in the experiment for comparable metal thicknesses. In terms of reliability, the alternative pad metals were within 0.1-0.2 V of each other and showed a narrower variation than the pure aluminum. The alternative pad metals also showed a relatively narrow variation when compared with the baseline metal type. The 2000 Å aluminum sample shows approximately a 6.5 times lower NBTI shift than the 40000 Å aluminum sample. The lower NBTI shift may be a reflection of reducing the thickness of the sample by a factor of twenty. The aluminum (40000 Å)/titanium (200 Å) combination showed comparable NBTI shifts with the rest of the metals. The observation that the smaller amount of titanium had a small NBTI shift suggested that, in certain experiments, titanium was not acting primarily as a hydrogen getter, but simply as a barrier between the aluminum and the dielectric layers of the MOSFET. In the conducted experiments, gold did have a low NBTI shift, but the NBTI shift was slightly larger than the shifts of indium, nickel, or tantalum. Therefore, as discussed herein, separating the aluminum pad metal, when present as a source pad 124, from physical contact with the dielectric layer results in a reduction of the NBTI shift in MOSFETs. Alternatively, other metals, such as those discussed above, may be used to form the source pad 124 and to achieve a reduction in the NBTI shift.

Therefore, as discussed herein, manufacturing a MOSFET with certain source electrode metals will largely inhibit or limit the drift illustrated in FIG. 3. In accordance with certain embodiments, the source electrode 124 may be comprised of a metal that limits a shift in the threshold voltage of the MOSFET device during operation. In certain embodiments, the metal may not produce dissolved atomic hydrogen in silica from water molecules. Further, the metal may be a diffusion barrier to hydrogen. In certain embodiments, the metal may serve as a method of keeping an aluminum pad metal from physical contact with a dielectric layer of a MOSFET. The metal may be deposited by using a sputtering method of depositing thin films or any other suitable deposition technique. For example, in certain embodiments, the source electrode 124 may be comprised of a thin film or layer (e.g., 2000 Å) of nickel (Ni) or a thin film or layer (e.g., 2000 Å) of tantalum. In other embodiments, the source electrode 124 may be comprised of a combination of metal layers. For example, the source electrode 124 may be comprised of a thin film or layer (e.g., 2000 Å) of gold (Au) layered with a thin film or layer (e.g., 100 Å) of Ni, or a film or layer (e.g., 40000 Å) of aluminum layered with a thin film or layer (e.g., 200 Å) of titanium. In certain embodiments, one of the layers of metal may be used as an adhesion layer to improve the contact of the source electrode 124 with the MOSFET. As will be appreciated, the various metals for use as or with a source electrode 124 as discussed herein merely represent examples of some such suitable metals or materials. Therefore, other metals or materials, alone or in combination with one another, may also be used to limit the effects of BTI (both positive and negative) as discussed herein and are encompassed by the present disclosure.

Technical effects of embodiments include a semiconductor device (e.g., a silicon carbide (SiC) device) designed to inhibit a shift in a threshold voltage of the semiconductor device during operation. In certain implementations, the semiconductor device includes a gate electrode disposed on an insulation layer, a source electrode, an inter-layer dielectric, a substrate, a well region, a source contact region, and a drain electrode. The source electrode is chosen to be a metal that inhibits a shift in a threshold voltage of the semiconductor device during operation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A metal-oxide field-effect transistor (MOSFET) device, comprising:
   a gate electrode;
   a substrate comprising silicon carbide and having a surface that supports the gate electrode and defines a surface normal direction, wherein the substrate includes:
   a drift region including a first dopant type so as to have a first conductivity type;
   a well region adjacent to the drift region and proximal to the surface, wherein the well region includes a second dopant type so as to have a second conductivity type and a channel region disposed proximal to the gate electrode; and
   a source contact region adjacent to the well region, wherein the source contact region having the first conductivity type;
   an inter-layer dielectric disposed about the gate electrode and on a portion of the surface of the substrate;
   a contact layer disposed on a portion of the surface of the substrate covering a portion of the source contact region; and
   a source electrode disposed over the inter-layer dielectric and in electrical contact with the source contact region, wherein the source electrode comprises indium, and/or gold and is comprised of a combination of metal layers, wherein the source electrode further comprises an aluminum layer and a layer of indium and/or gold, and the layer of aluminum is physically separated from the inter-layer dielectric by the layer of indium and/or gold.

2. A semiconductor device comprising:
   a gate electrode disposed on an insulation layer;
   a source electrode, wherein the source electrode comprises indium, and/or gold and is comprised of a combination of metal layers, wherein the source electrode further comprises an aluminum layer and a layer of indium and/or gold, and the layer of aluminum is physically separated from the inter-layer dielectric by the layer of indium and/or gold;
   an inter-layer dielectric (ILD) disposed between the gate electrode and the insulation layer, and the source electrode;
   a source contact region, wherein the source contact region contacts both the source electrode and a well region and is either n-type or p-type;
   a silicon carbide substrate upon which the insulation layer, the source contact region, and the inter-layer dielectric are disposed, wherein the silicon carbide substrate is either n-type or p-type;
   the well region, wherein the well region extends into the silicon carbide substrate and is either n-type or p-type; and
   a drain electrode disposed on an opposite side of the silicon carbide substrate from the gate electrode.

* * * * *